(12) United States Patent
Iwaida et al.

(10) Patent No.: US 7,982,551 B2
(45) Date of Patent: Jul. 19, 2011

(54) VOLTAGE CONTROLLED OSCILLATOR HAVING TEMPERATURE DETECTING CIRCUIT

(75) Inventors: Mineyuki Iwaida, Kyoto (JP); Yasuo Oba, Shiga (JP); Takeshi Fujii, Osaka (JP)

(73) Assignee: Panasonic Corporation, Osaka (JP)

( * ) Notice: Subject to any disclaimer, the term of this patent is extended or adjusted under 35 U.S.C. 154(b) by 226 days.

(21) Appl. No.: 12/294,177

(22) PCT Filed: Mar. 23, 2007

(86) PCT No.: PCT/JP2007/056025
§ 371 (c)(1),
(2), (4) Date: Sep. 23, 2008

(87) PCT Pub. No.: WO2007/108534
PCT Pub. Date: Sep. 27, 2007

(65) Prior Publication Data
US 2009/0231044 A1     Sep. 17, 2009

(30) Foreign Application Priority Data

Mar. 23, 2006  (JP) ................. 2006-080292

(51) Int. Cl.
*H03L 1/00* (2006.01)
(52) U.S. Cl. .............. 331/176; 331/167; 331/117 R; 331/117 FE; 331/16; 331/177 V
(58) Field of Classification Search .......... 331/177 V, 331/34, 16, 176
See application file for complete search history.

(56) References Cited

U.S. PATENT DOCUMENTS

| 5,355,098 | A | 10/1994 | Iwasaki |
| 6,563,387 | B2 | 5/2003 | Hirano et al. |
| 7,164,325 | B2 * | 1/2007 | Aparin et al. ............ 331/176 |
| 7,463,097 | B2 * | 12/2008 | Costa et al. ............ 331/14 |
| 2004/0189417 | A1 | 9/2004 | Fujita |

FOREIGN PATENT DOCUMENTS

| CN | 1326304 | 12/2001 |
| JP | 55-118207 | 9/1980 |
| JP | 61-44922 | 3/1986 |
| JP | 1-192205 | 8/1989 |
| JP | 5-304467 | 11/1993 |

(Continued)

OTHER PUBLICATIONS

Chinese Office Action issued Aug. 27, 2010 in Application No. 200780010045.5.

(Continued)

*Primary Examiner* — Arnold Kinkead
(74) *Attorney, Agent, or Firm* — Wenderoth, Lind & Ponack, L.L.P.

(57) ABSTRACT

A VCO circuit includes a temperature detector circuit, a voltage generator circuit, a switch, a resonance circuit and an oscillator. The temperature detector detects a temperature, and the voltage generator circuit generates a voltage for coarse adjustment corresponding to the detected temperature and outputs the same voltage. The switch selects one of a DC voltage for fine adjustment and the voltage for coarse adjustment. The resonance circuit includes a varactor diode having a capacitance value adjusted based on the voltage selected by the switch, capacitors and an inductor, and has a predetermined resonance frequency. The oscillator generates an oscillation signal having an oscillation frequency corresponding to the resonance frequency by using the resonance circuit and outputs the same signal.

12 Claims, 10 Drawing Sheets

| FOREIGN PATENT DOCUMENTS | | |
|---|---|---|
| JP | 7-106960 | 4/1995 |
| JP | 9-246958 | 9/1997 |
| JP | 11-220872 | 8/1999 |
| JP | 3488180 | 10/2003 |

OTHER PUBLICATIONS

International Search Report issued May 1, 2007 in the International (PCT) Application No. PCT/JP2007/056025.

* cited by examiner

VOLTAGE CONTROLLED OSCILLATOR HAVING TEMPERATURE DETECTING CIRCUIT

TECHNICAL FIELD

The present invention relates to a voltage controlled oscillator circuit (referred to as a VCO (Voltage Controlled Oscillator) circuit hereinafter) having temperature detector means, and a wireless communication apparatus having the same circuit.

BACKGROUND ART

In recent years, the digitalization of broadcasting allows mobile terminals to receive the broadcasting. VCO circuits for use in the mobile terminals for receiving are required to receive the broadcasting signals within a wide frequency range and stably operate even in an environment such as in the vehicles having a wide operating temperature range, in addition to having the characteristics of compactness, a low power consumption and so on. In response to these requirements, a Patent Document 1 discloses a phase locked loop circuit (referred to as a PLL (Phase Locked Loop) circuit hereinafter) employing a VCO circuit having a wide oscillation frequency range.

Figure 11:
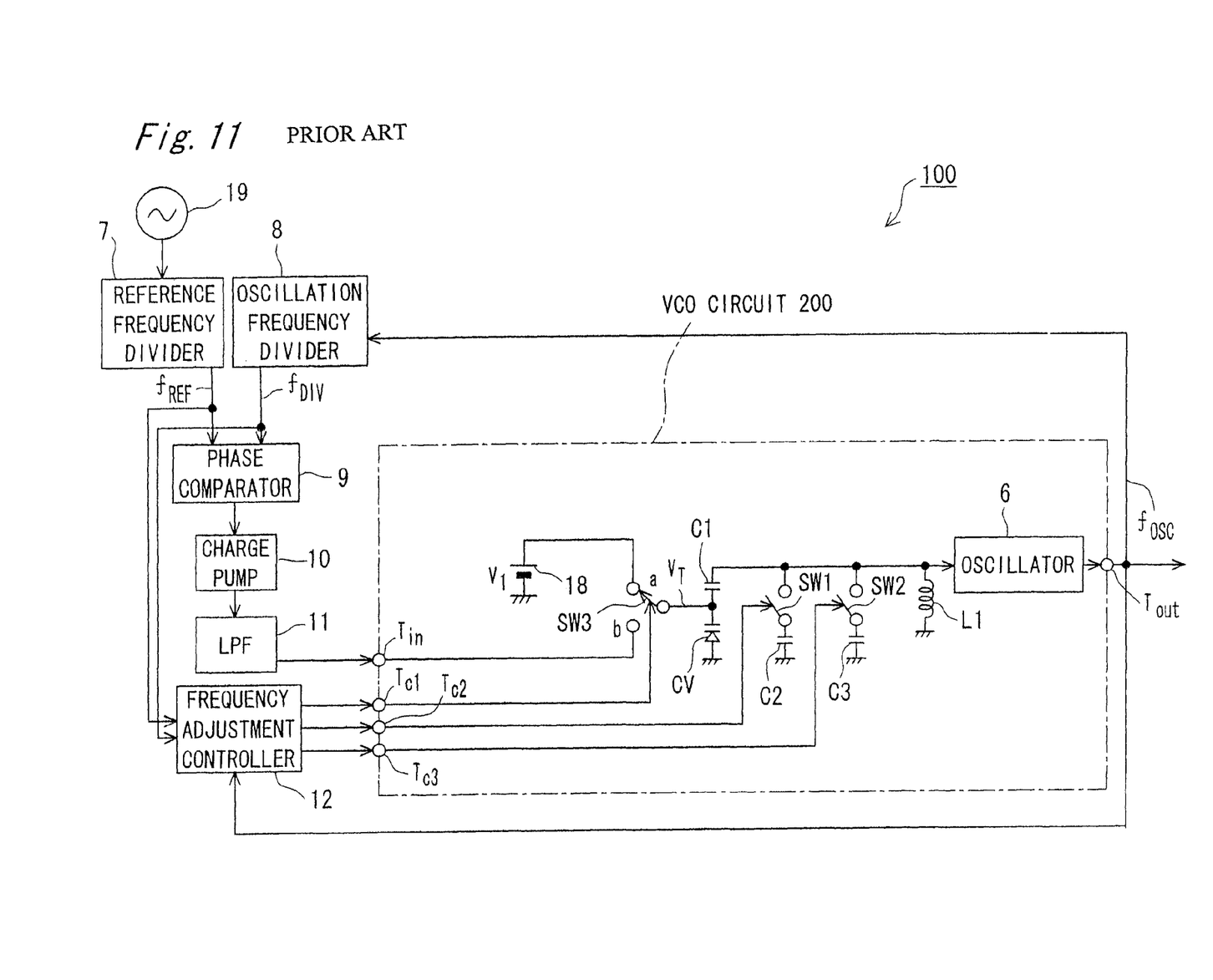
FIG. 11 is a block diagram showing a configuration of a PLL circuit 100 according to a prior art.

FIG. 11 is a block diagram showing a configuration of a PLL circuit 100 according to the prior art described in the Patent Document 1. In a VCO circuit 200 of the PLL circuit 100 of FIG. 11, a resonance circuit configured by including a varactor diode CV, capacitors C2 and C3, and an inductor L1 connected in parallel with each other, has a predetermined resonance frequency determined by the respective values of the varactor diode CV, the capacitors C2 and C3 and the inductor L1. An oscillator 6 generates an oscillation signal having an oscillation frequency corresponding to the resonance frequency using the resonance circuit, and outputs the same signal. First of all, the resonance frequency of the VCO circuit 200 is coarsely adjusted by applying an output voltage $V_1$ of a constant voltage source 18 to the varactor diode CV via a switch SW3, and controlling switches SW1 and SW2 to select a band, and thereafter, finely adjusted by the PLL circuit 100 by applying a voltage from a low-pass filter (referred to as a LPF hereinafter) 11 to the varactor diode CV via a voltage application terminal Tin and the switch SW3.

Figure 12:
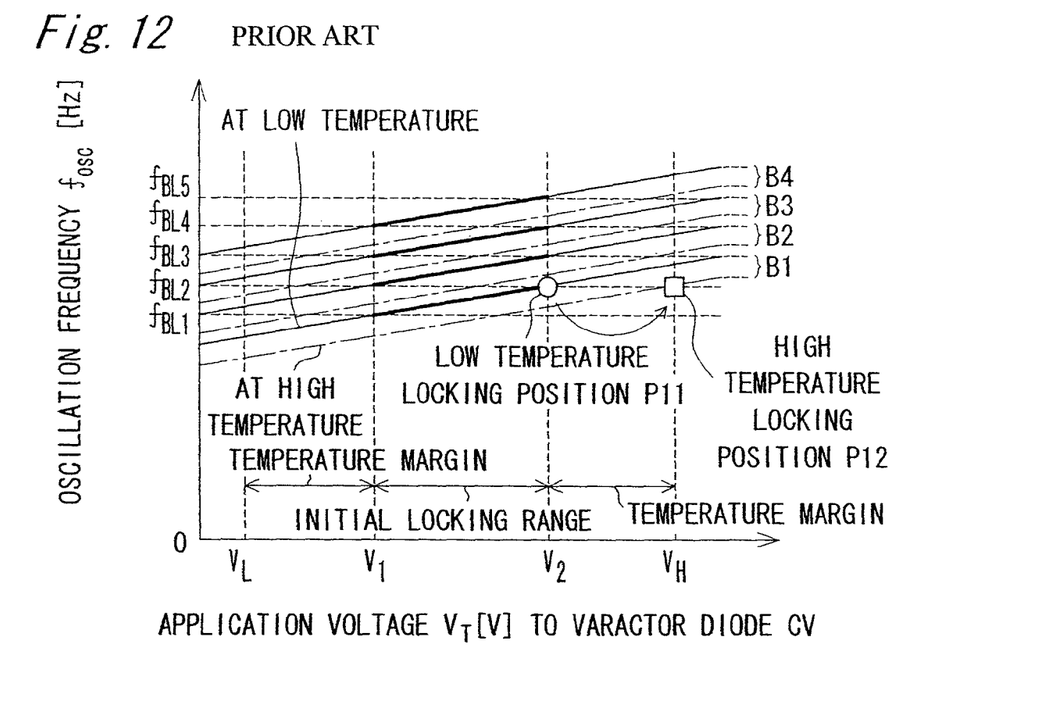
FIG. 12 is a characteristic diagram showing a relation between the varactor application voltage $V_T$ and the oscillation frequency $f_{OSC}$, showing a temperature change from a low temperature to a high temperature in the PLL circuit 100 of FIG. 11.
Figure 13:
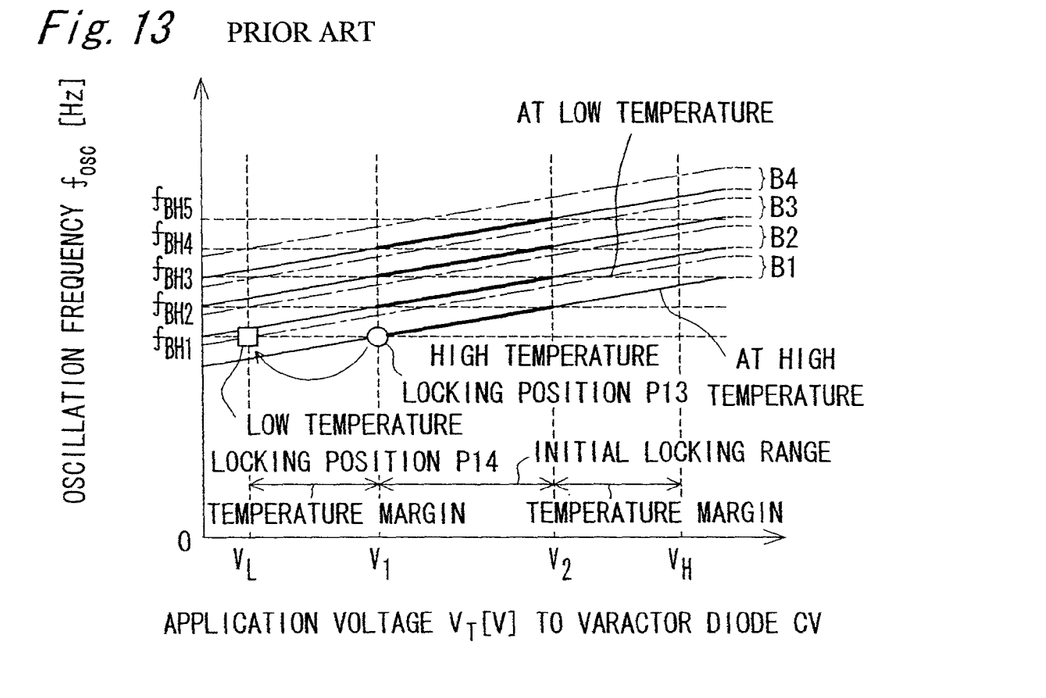
FIG. 13 is a characteristic diagram showing a relation between the varactor application voltage $V_T$ and the oscillation frequency $f_{OSC}$, showing a temperature change from a high temperature to a low temperature in the PLL circuit 100 of FIG. 11.

FIGS. 12 and 13 are characteristic diagrams showing relations between an application voltage $V_T$ (referred to as a varactor application voltage $V_T$ hereinafter) to the varactor diode CV and an oscillation frequency $f_{OSC}$, showing temperature changes from a low temperature to a high temperature, and from a high temperature to a low temperature, respectively, in the PLL circuit 100 of FIG. 11. Generally speaking, the oscillation circuit has a temperature characteristic, and therefore, an initial locking range is set. In this case, the initial locking range is a voltage range at an initial timing when the PLL circuit 100 is locked to the oscillation frequency $f_{OSC}$ fallen within a desired frequency range based on the temperature characteristic. Referring to FIG. 12, $f_{BL1}$ to $f_{BL5}$ indicate lower-limit or upper-limit oscillation frequencies in bands B1 to B4. At a low temperature, for example, when the varactor application voltage $V_T$ has an upper limit value $V_2$ in the initial locking range, the PLL circuit 100 is locked at a low temperature locking position P11. Subsequently, the characteristic of the oscillation frequency $f_{OSC}$ is lowered as a whole when the temperature increases, whereas the locked state is held by the PLL circuit 100 to a high temperature locking position P12 where the varactor application voltage $V_T$ becomes a voltage $V_H$. In addition, referring to FIG. 13, $f_{BH1}$ to $f_{BH5}$ indicate lower-limit or upper-limit oscillation frequencies in the bands B1 to B4. At a high temperature, for example, when the varactor application voltage $V_T$ has a lower limit value $V_1$ in the initial locking range, the PLL circuit 100 is locked at a high temperature locking position P13. Subsequently, the characteristic of the oscillation frequency $f_{OSC}$ is raised as a whole when the temperature decreases, whereas the locked state is held by the PLL circuit 100 to a low temperature locking position P14 where the varactor application voltage $V_T$ becomes a voltage $V_L$.

Patent Document 1: Japanese patent No. 3488180.

DISCLOSURE OF THE INVENTION

Problems to be Solved by the Invention

However, as shown in FIGS. 12 and 13, in the PLL circuit 100 of the prior art, in order to consider a temperature change after the initial locking, predetermined temperature margins should be secured, and therefore, the PLL circuit 100 of the prior has such a problem that the oscillation frequency range thereof is narrowed by the temperature margins.

In the resonance circuit of the VCO circuit 200 of FIG. 11, the oscillation frequency range thereof can be widened by, for example, increasing the number of the switches SW1 and SW2, and the number of the sets of the switch SW1 and the capacitor C1 connected in series to the switch SW1, and the switch SW2 and the capacitor C2 connected in series to the switch SW2. However, the size of the resonance circuit increases, and, when the VCO circuit is incorporated in a semiconductor integrated circuit, a parasitic capacitance added to the resonance circuit increases, and this leads to the deterioration in the phase noise of the VCO circuit. The influence of the deterioration in the phase noise due to the increase in the parasitic capacitance can be suppressed by increasing the current of the VCO circuit, however, the power consumption increases in the case. In addition, the oscillation frequency range can be widened by setting a frequency control sensitivity ($f_{OSC}/V_T$) to a higher value. However, in the case, the fluctuation of the oscillation frequency $f_{OSC}$ with respect to a voltage noise superimposed on the varactor application voltage $V_T$ increases, and this leads to the deterioration in the phase noise of the VCO circuit. There is such a problem that, when multi-value phase-modulated signals are handled in a wireless communication apparatus having a VCO circuit with the deteriorated phase noise, the bit error rate is lowered, and this leads to a difficulty in reproducing high-quality pictures and sounds and data.

An object of the present invention is to provide a voltage controlled oscillator circuit capable of solving the above problems and having a wide oscillation frequency range without deteriorating the phase noise thereof, and a wireless communication apparatus having the same circuit.

Means for Solving the Problems

According to the first aspect of the present invention, a voltage controlled oscillator circuit includes temperature detector means, switch means, a resonance circuit and oscillator means. The temperature detector means detects a temperature, generates a first control voltage for coarse adjustment corresponding to the detected temperature, and outputs the first control voltage. The switch means selects one of an inputted second control voltage for fine adjustment and the first control voltage for coarse adjustment. The resonance circuit has a predetermined resonance frequency, and includes a varactor element having a capacitance value adjusted based on a control voltage selected by the switch means, at least one capacitor, and an inductor. The oscillator means generates an oscillation signal having an oscillation frequency corresponding to the resonance frequency using the resonance circuit, and outputs the oscillation signal.

In the above-mentioned voltage controlled oscillator circuit, the temperature detector means preferably operates by a power voltage, and the applied power voltage is controlled in response to an inputted power control signal.

In addition, the above-mentioned voltage controlled oscillator circuit preferably further includes current controller means for controlling a current of the oscillator means in response to the temperature detected by the temperature detector means.

Further, in the above-mentioned voltage controlled oscillator, the temperature detector means preferably holds the first control voltage at a constant when the switch means selects the first control voltage.

Still further, the above-mentioned voltage controlled oscillator circuit preferably further includes a phase locked loop circuit for generating the second control voltage based on an oscillation signal outputted by the voltage controlled oscillator circuit.

According to the first aspect of the present invention, a wireless communication apparatus for transmitting and receiving a wireless signal includes the above-mentioned voltage controlled oscillator circuit and frequency converter means for performing frequency conversion on the wireless signal by using the oscillation signal from the voltage controlled oscillator circuit.

Effects of the Invention

Accordingly, the voltage controlled oscillator circuit of the present invention and the wireless communication apparatus having the same circuit according to the present invention include the temperature detector means for generating the first control voltage for coarse adjustment corresponding to the temperature detected by detecting the temperature and outputting the same voltage, and therefore, exhibit such an advantageous effect that the temperature margins of the oscillation frequency can be reduced and a wide oscillation frequency range can be obtained without deteriorating the phase noise.

DESCRIPTION OF REFERENCE SYMBOLS 1, 1A, 1B and 1C . . . PLL circuit,
2, 2A, 2B and 2C . . . VCO circuit,
4, 4A and 4C . . . Temperature detector circuit,
5 and 5A . . . Voltage generator circuit,
6 and 6B . . . Oscillator,
7 . . . Reference frequency divider,
8 . . . Oscillation frequency divider,
9 . . . Phase comparator,
10 . . . Charge pump,
11 . . . LPF,
12 . . . Frequency adjustment controller,
13 and 14 . . . Current source,
15 . . . Comparator,
19 . . . Reference frequency generator,
20 . . . Current controller circuit,
21 and 22 . . . Constant voltage source,
30 . . . Antenna,
31 . . . Circulator,
32 . . . Low-noise amplifier (LNA),
33 and 36 . . . Bandpass filter (BPF),
34 and 37 . . . Mixer,
35 . . . Power amplifier (PA),
38 . . . Baseband signal processing circuit,
C1, C2 and C3 . . . Capacitor,
CV . . . Varactor diode,
L1 . . . Inductance,
R1, R2 and R3 . . . Resistor,
SW1, SW2, SW3, SW4 and SW5 . . . Switch,
Tin . . . Voltage application terminal,
Tc1, Tc2 and Tc3 . . . Control terminal,
Tout . . . Oscillation signal output terminal, and
Tvc . . . Power control terminal.

BEST MODE FOR CARRYING OUT THE INVENTION

Embodiments according to the present invention will be described hereinafter with reference to the drawings. Components similar to each other are denoted by the same reference numerals.

First Preferred Embodiment

Figure 1:
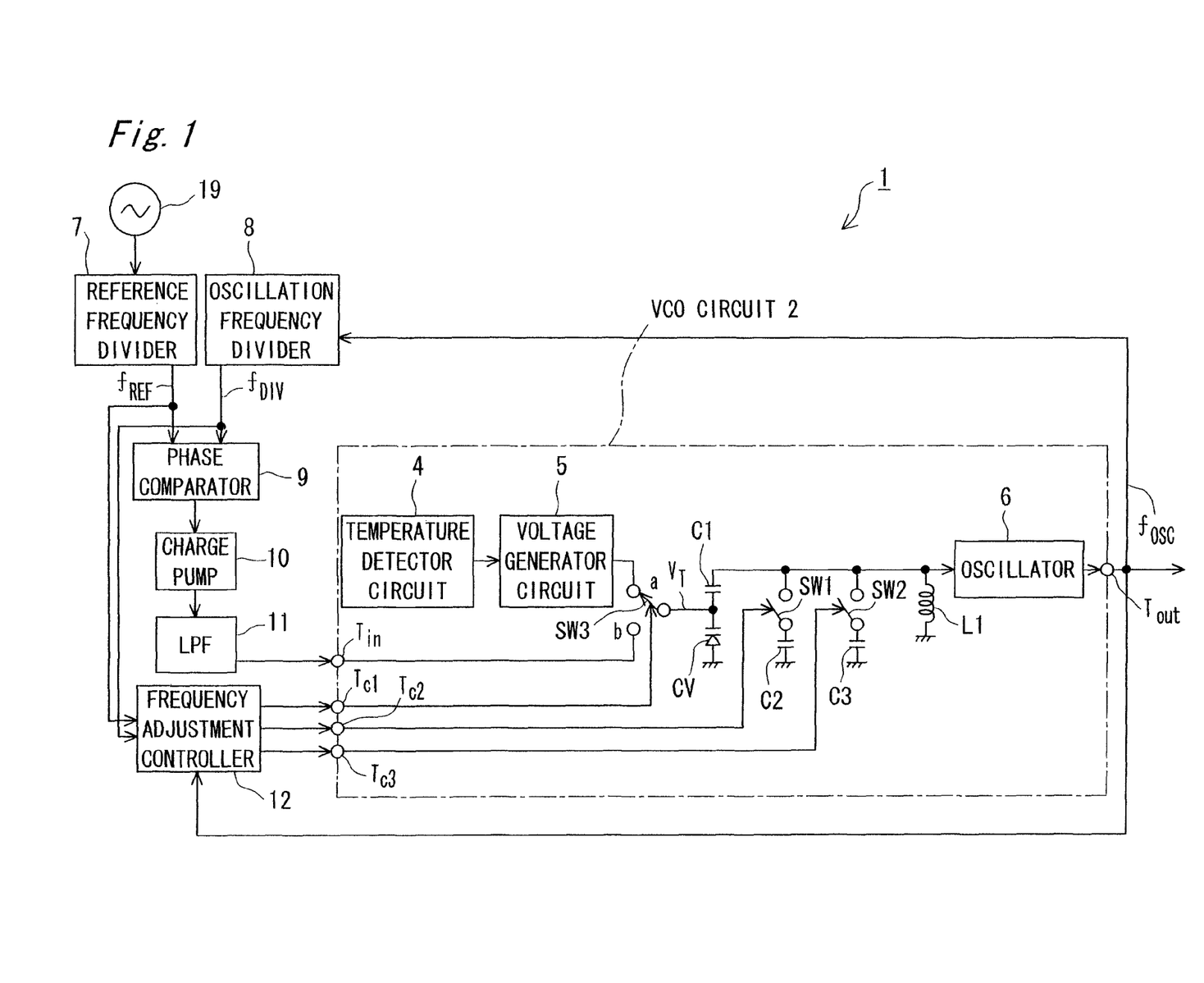
FIG. 1 is a block diagram showing a configuration of a PLL circuit 1 according to a first preferred embodiment of the present invention.

FIG. 1 is a block diagram showing a configuration of a PLL circuit 1 according to the first preferred embodiment of the present invention. Referring to FIG. 1, the PLL circuit 1 is provided in, for example, a tuner to generate a local oscillation signal, and is configured to include a VCO circuit 2, a reference frequency divider 7, an oscillation frequency divider 8, a phase comparator 9, a charge pump 10, a low-pass filter (referred to as a LPF hereinafter) 11, a frequency adjustment controller 12 and a reference frequency generator 19. The components provided in the PLL circuit 1 are formed on one IC chip.

The reference frequency generator 19 generates a reference frequency signal having a predetermined reference frequency, and outputs the same signal to the reference frequency divider 7. The reference frequency divider 7 divides a frequency of the inputted reference frequency signal by a predetermined division ratio, and outputs a divided reference frequency signal $f_{REF}$ to the phase comparator 9 and the frequency adjustment controller 12. The oscillation frequency divider 8 divides a frequency of an inputted oscillation frequency signal $f_{OSC}$ by a predetermined division ratio, and outputs a divided oscillation frequency signal $f_{DIV}$ to the phase comparator 9 and the frequency adjustment controller 12. The phase comparator 9 compares a phase of the inputted divided reference frequency signal $f_{REF}$ with a phase of the divided oscillation frequency signal $f_{DIV}$, and outputs a DC voltage of the signal indicating the comparison result to the VCO circuit 2 via the charge pump 10 and the LPF 11. The frequency adjustment controller 12 detects a difference between a frequency of the inputted divided reference frequency signal $f_{REF}$ and a frequency of the divided oscillation frequency signal $f_{DIV}$, and performs selection of coarse adjustment and fine adjustment, and selection of a band (described in detail later) based on the detected difference.

The VCO circuit 2 is configured to include a temperature detector circuit 4, a voltage generator circuit 5, an oscillator 6, switches SW1, SW2 and SW3, capacitors C1, C2 and C3, a varactor diode CV, and an inductance L1. In the VCO circuit 2, the capacitors C2 and C3, the varactor diode CV, the switches SW1 and SW2 and the inductance L1 constitute a resonance circuit having a resonance frequency determined by capacitance values of the varactor diode CV and the capacitors C2 and C3, and the inductance value of the inductor L1. The temperature detector circuit 4 detects a temperature, and outputs a signal indicating the temperature detection result corresponding to the detected temperature to the voltage generator circuit 5. The voltage generator circuit 5 generates and outputs a voltage corresponding to the signal indicating the temperature detection result from the temperature detector circuit 4. The switch SW3 selects a contact "a" thereof or a contact "b" thereof in response to a control signal inputted via a control terminal Tc1. The switch SW3 applies the output voltage from the voltage generator circuit 5 to the varactor diode CV when the contact "a" thereof is selected, and applies a DC voltage from the LPF 11 to the varactor diode CV via a voltage application terminal Tin when the contact "b" thereof is selected. The capacitor C1 and the varactor diode CV are connected in series with each other to constitute a series circuit, and the series circuit is provided between the oscillator 6 and a ground potential. A connecting point between the capacitor C1 and the varactor diode CV is connected to a common terminal of the switch SW3. The capacitance value of the varactor diode CV is determined by a bias voltage applied thereto via the switch SW3. The capacitor C1 separates the DC bias voltage applied to the varactor diode CV from a bias voltage of the oscillator 6.

The switches SW1 and SW2 are controlled by control signals inputted from the frequency adjustment controller 12 via the control terminals Tc2 and Tc3, respectively. When the switches SW1 and SW2 are turned ON, the switches SW1 and SW2 connect the capacitors C2 and C3 in parallel to the series circuit including the capacitor C1 and the varactor diode CV, respectively. On the other hand, when the switches SW1 and SW2 are turned OFF, the switches SW1 and SW2 disconnect the capacitors C2 and C3 from the series circuit including the capacitor C1 and the varactor diode CV, respectively. The inductance L1 is connected in parallel to the series circuit including the capacitor C1 and the varactor diode CV. The oscillator 6 generates the oscillation signal having the oscillation frequency $f_{OSC}$ corresponding to the resonance frequency by using the resonance circuit, and outputs the same signal via an oscillation signal output terminal Tout. The oscillation signal $f_{OSC}$ outputted from the oscillation signal output terminal Tout is inputted to the oscillation frequency divider 8. Then, the oscillation signal $f_{OSC}$ is applied to the voltage application terminal Tin of the VCO circuit 2 via the phase comparator 9, the charge pump 10 and the LPF 11 as a DC voltage of the control voltage for fine adjustment again, to perform loop control so that the capacitance value of the varactor diode CV is held at a predetermined value, and the PLL circuit 1 is locked.

Figure 2:
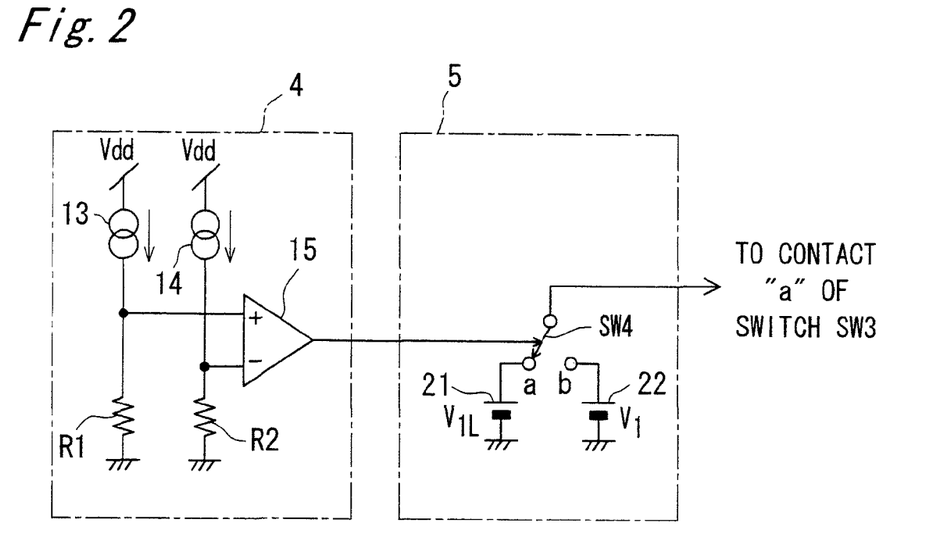
FIG. 2 is a circuit diagram showing one example of detailed configurations of a temperature detector circuit 4 and a voltage generator circuit 5 of FIG. 1.

FIG. 2 is a circuit diagram showing one example of detailed configurations of the temperature detector circuit 4 and the voltage generator circuit 5 of FIG. 1. Referring to FIG. 2, the temperature detector circuit 4 is configured to include current sources 13 and 14, resistors R1 and R2, and a comparator 15. The voltage generator circuit 5 is configured to include constant voltage sources 21 and 22, and a switch SW4. The current source 13 is connected to a power voltage Vdd, and set so as to output a current that changes with a predetermined temperature characteristic of a base-emitter voltage $V_{BE}$ of a bipolar transistor constituting the current source 13. The voltage source 14 is connected to the power voltage Vdd, and outputs a constant current regardless of the temperature change. The resistors R1 and R2 transform the currents supplied by the current sources 13 and 14 into voltages, and apply the voltages to a non-inverted input terminal (+) and an inverted input terminal (−) of the comparator 15, respectively. One of the voltages inputted to the comparator 15 changes based on the predetermined temperature characteristic, and another one is held at a fixed reference voltage. Accordingly, it is possible to change an output voltage of the comparator 15 depending on whether or not the temperature is lower than a predetermined threshold temperature determined by a resistance ratio of the resistors R1 and R2. For example, the comparator 15 outputs a signal having a voltage level of 0 V at a low temperature lower than the predetermined threshold temperature, and outputs a signal having a voltage level of a predetermined power voltage at a high temperature higher than the predetermined threshold temperature. The switch SW4 of the voltage generator circuit 5 applies an output voltage $V_{1L}$ of the constant voltage source 21 to the varactor diode CV via a contact "a" thereof and the contact "a" of the switch SW3 of FIG. 1 as a control voltage for coarse adjustment, when the voltage level of the output signal of the comparator 15 is 0 V, i.e., at the low temperature. On the other hand, the switch SW4 applies an output voltage $V_1$ of the constant voltage source 22 to the varactor diode CV via a contact "b" thereof and the contact "a" of the switch SW3 of FIG. 1 as a control voltage for coarse adjustment, when the voltage level of the output signal of the comparator 15 is the power voltage, i.e., at the high temperature. It is noted that a relational expression expressed by the following Equation (1) holds between the output voltage $V_{1L}$ and the output voltage $V_1$:

[Equation 1]

$$V_{1L} < V_1 \qquad (1).$$

The operation of the PLL circuit 1 configured as described above is explained below with reference to FIG. 3 to FIG. 5.

Figure 3:
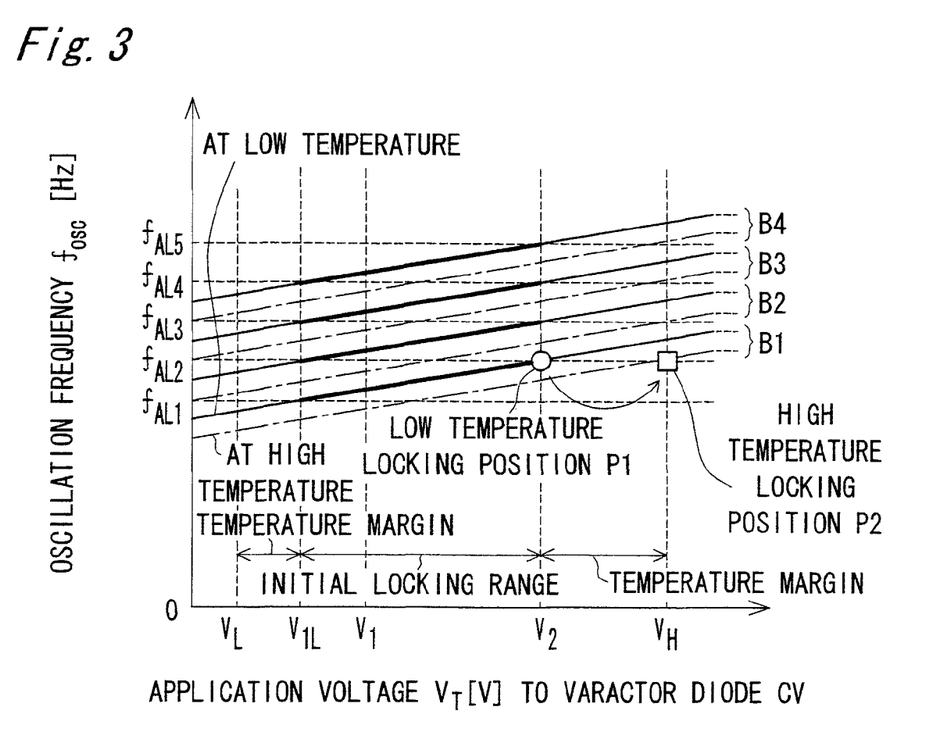
FIG. 3 is a characteristic diagram showing a relation between a varactor application voltage $V_T$ and an oscillation frequency $f_{OSC}$, showing a temperature change from a low temperature to a high temperature in the PLL circuit 1 of FIG. 1.

FIG. 3 is a characteristic diagram showing a relation between the varactor application voltage $V_T$ and the oscillation frequency $f_{OSC}$, showing a temperature change from a low temperature to a high temperature in the PLL circuit 1 of FIG. 1. Referring to FIG. 3, solid lines show relations between the varactor application voltage $V_T$ and the oscillation frequency $f_{OSC}$ at low temperatures when the temperature detected by the temperature detector circuit 4 is lower than the predetermined threshold temperature, and dashed-dotted lines show relations between the varactor application voltage $V_T$ and the oscillation frequency $f_{OSC}$ at high temperatures when the temperature is increased from the low temperature. $V_L$ and $V_H$ indicate an output lower limit voltage and an output upper limit voltage of the charge pump 10, respectively. Each of the characteristics of the bands B1 to B4 shows a relation between the varactor application voltage $V_T$ and the oscillation frequency $f_{OSC}$ of each of combinations of ON and OFF of the switches SW1 and SW2 of the VCO circuit 2 of FIG. 1. For example, both of the switches SW1 and SW2 are turned ON in the band B1, only the switch SW1 is turned ON in the band B2, only the switch SW2 is turned ON in the band B3, and both of the switches SW1 and SW2 are turned OFF in the band B4. $f_{AL1}$ to $f_{AL5}$ show lower-limit or upper-limit oscillation frequency in each of the bands B1 to B4. The oscillation occurs at a frequency between the oscillation frequency $f_{AL1}$ and oscillation frequency $f_{AL2}$ in the band B1, the oscillation occurs at a frequency between the oscillation frequency $f_{AL2}$ and the oscillation frequency $f_{AL3}$ in the band B2, the oscillation occurs at a frequency between the oscillation frequency $f_{AL3}$ and the oscillation frequency $f_{AL4}$ in the band B3, and th oscillation occurs at a frequency between the oscillation frequency $f_{AL4}$ and the oscillation frequency $f_{AL5}$ in the band B4. Accordingly, the VCO circuit 2 of FIG. 1 outputs the oscillation signal having the oscillation frequency $f_{OSC}$ within a frequency range from the oscillation frequency $f_{AL1}$ to the oscillation frequency $f_{AL5}$. In addition, $V_1$ indicates the output voltage of the constant voltage source 22, $V_{1L}$ indicates the output voltage of the constant voltage source 21, and $V_2$ indicates the upper limit value in the initial locking range when the lower limit value in the initial locking range is $V_{1L}$.

Referring to FIG. 3, first of all, at the low temperature, the output voltage $V_{1L}$ of the constant voltage source 21 of the voltage generator circuit 5 is applied to the varactor diode CV by the switch SW4 of the temperature generator circuit 5, and thereafter, a combination of the capacitors C2 and C3 corresponding to the control signals are connected in parallel to the varactor diode CV by the switches SW1 and SW2, respectively, to select one of the bands B1 to B4. By this operation, the oscillation frequency $f_{OSC}$ is coarsely adjusted. Subsequently, the DC voltage from the LPF 11 is applied to the varactor diode CV by the switch SW3, and the oscillation frequency $f_{OSC}$ is finely adjusted and locked by the PLL circuit 1. It is noted that, in the fine adjustment operation, the states of the switches SW1 and SW2 set at the time of coarse adjustment are not changed. When the temperature is sufficiently low, the varactor application voltage $V_T$ has the upper limit value $V_2$ in the initial locking range, and the oscillation frequency $f_{OSC}$ is locked at a low temperature locking position P1 where the oscillation frequency $f_{OSC}$ is $f_{AL2}$. Subsequently, the characteristic of the oscillation frequency $f_{OSC}$ is lowered as a whole when the temperature increases, whereas the locked state is held by the PLL circuit 1 to a high temperature locking position P2, where the varactor application voltage $V_T$ becomes the voltage $V_H$.

Accordingly, when the temperature immediately after the locking is sufficiently low, it is determined that the varactor application voltage $V_T$ scarcely changes in a direction in which it is lowered, and the voltage $V_{1L}$ is applied to the varactor diode CV by the switch SW4 of the voltage generator circuit 5 to reduce the temperature margin on the lower voltage side of the varactor application voltage $V_T$. This leads to a widened initial locking range widened by the reduced temperature margin, namely the oscillation frequency range can be widened. Referring to FIG. 3, the temperature margin is reduced, and the initial locking range and the oscillation frequency range are widened as compared with FIG. 12 on which the operation of the PLL circuit 100 of the prior art was described.

Figure 4:
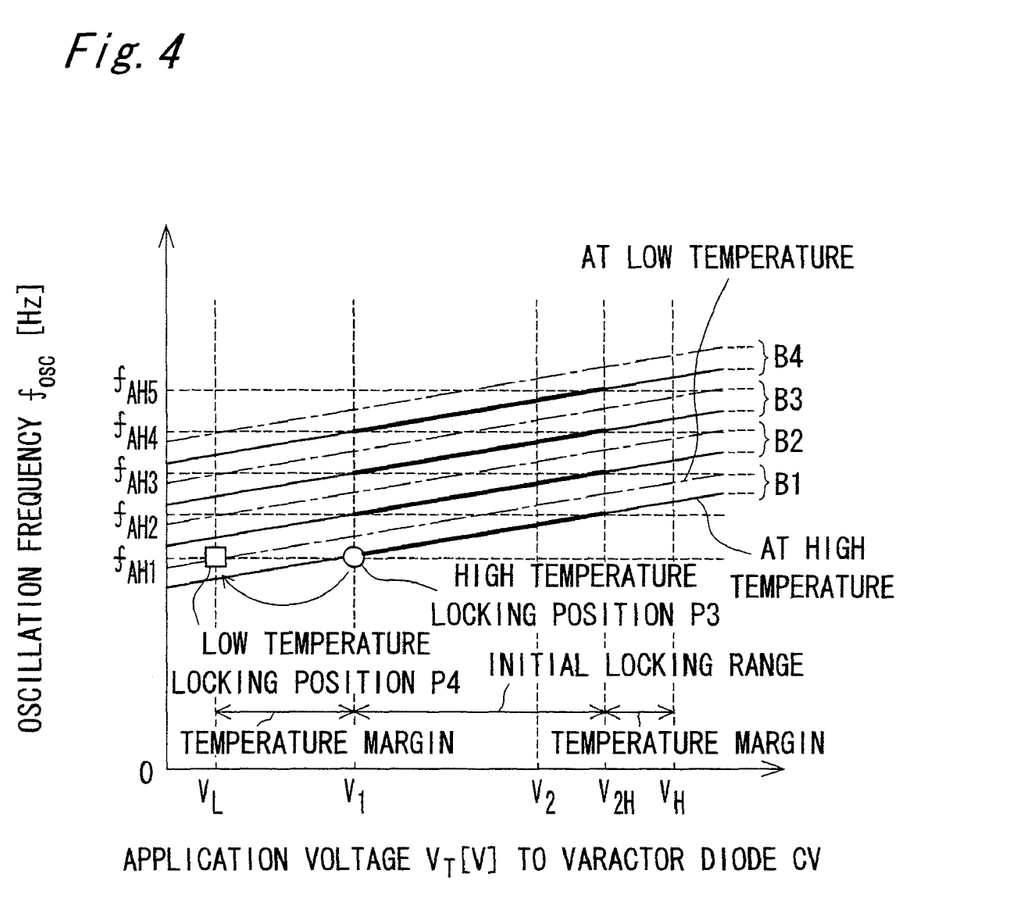
FIG. 4 is a characteristic diagram showing a relation between the varactor application voltage $V_T$ and the oscillation frequency $f_{OSC}$, showing a temperature change from a high temperature to a low temperature in the PLL circuit 1 of FIG. 1.

FIG. 4 is a characteristic diagram showing a relation between the varactor application voltage $V_T$ and the oscillation frequency $f_{OSC}$, showing a temperature change from a high temperature to a low temperature in the PLL circuit 1 of FIG. 1. Referring to FIG. 4, solid lines show relations between the varactor application voltage $V_T$ and the oscillation frequency $f_{OSC}$ at high temperatures when the temperature detected by the temperature detector circuit 4 is higher than the predetermined threshold temperature, and dashed-dotted lines show relations between the varactor application voltage $V_T$ and the oscillation frequency $f_{OSC}$ at low temperatures when the temperature is lowered from the high temperature. $V_L$ and $V_H$ and the bands B1 to B4 are similar to those of FIG. 3, respectively. $f_{AH1}$ to $f_{AH5}$ show the lower-limit or upper-limit oscillation frequencies in the bands B1 to B4. The oscillation occurs at a frequency between the oscillation frequency $f_{AH1}$ to the oscillation frequency $f_{AH2}$ in the band B1, the oscillation occurs at a frequency between the oscillation frequency $f_{AH2}$ to the oscillation frequency $f_{AH3}$ in the band B2, the oscillation occurs at a frequency between the oscillation frequency $f_{AH3}$ to the oscillation frequency $f_{AH4}$ in the band B3, and the oscillation occurs at a frequency between the oscillation frequency $f_{AH4}$ to the oscillation frequency $f_{AH5}$ in the band B4. Accordingly, the VCO circuit 2 of FIG. 1 outputs the oscillation signal having the oscillation frequency $f_{OSC}$ within a frequency range from the oscillation frequency $f_{AH1}$ to the oscillation frequency $f_{AH5}$. In addition, $V_1$ indicates the output voltage of the constant voltage source 22, $V_{2H}$ indicates the upper limit value in the initial locking range when the lower limit value in the initial locking range is $V_1$.

Referring to FIG. 4, first of all, at the high temperature, the output voltage $V_1$ of the constant voltage source 22 of the voltage generator circuit is applied to the varactor diode CV by the switch SW4 of the temperature generator circuit 5, and thereafter, a combination of the capacitors C2 and C3 corresponding to the control signals are connected in parallel to the varactor diode CV by the switches SW1 and SW2, respectively, to select one of the bands B1 to B4. By this operation, the oscillation frequency $f_{OSC}$ is coarsely adjusted. Subsequently, the DC voltage from the LPF 11 is applied to the varactor diode CV by the switch SW3, and the oscillation frequency $f_{OSC}$ is finely adjusted and locked by the PLL circuit 1. It is noted that, in the fine adjustment operation, the states of the switches SW1 and SW2 set at the time of coarse adjustment are not changed. When the temperature is sufficiently high, the varactor application voltage $V_T$ has the lower limit value $V_1$ of the initial locking range, and the oscillation frequency $f_{OSC}$ is locked at a high temperature locking position P3 where the oscillation frequency $f_{OSC}$ is $f_{AH1}$. Subsequently, the characteristic of the oscillation frequency $f_{OSC}$ increases as a whole when the temperature decreases, whereas the locked state is held by the PLL circuit 1 to a low temperature locking position P4 where the varactor application voltage $V_T$ becomes the voltage $V_L$.

Accordingly, when the temperature immediately after the locking is sufficiently high, it is determined that the varactor application voltage $V_T$ scarcely changes in a direction in which it increases, and the voltage $V_1$ is applied to the varactor diode CV by the switch SW4 of the voltage generator circuit 5 to reduce the temperature margin on the higher voltage side of the varactor application voltage $V_T$. This leads to a widened initial locking range widened by the reduced temperature margin, namely the oscillation frequency range can be widened. Referring to FIG. 4, the temperature margin is reduced, and the initial locking range and the oscillation frequency range are widened as compared with FIG. 13 on which the operation of the PLL circuit 100 of the prior art was described.

Accordingly, by widening the initial locking ranges of the bands B1 to B4 as shown in FIGS. 3 and 4, a wide oscillation frequency range can be achieved without any deterioration in the phase noise.

Figure 5:
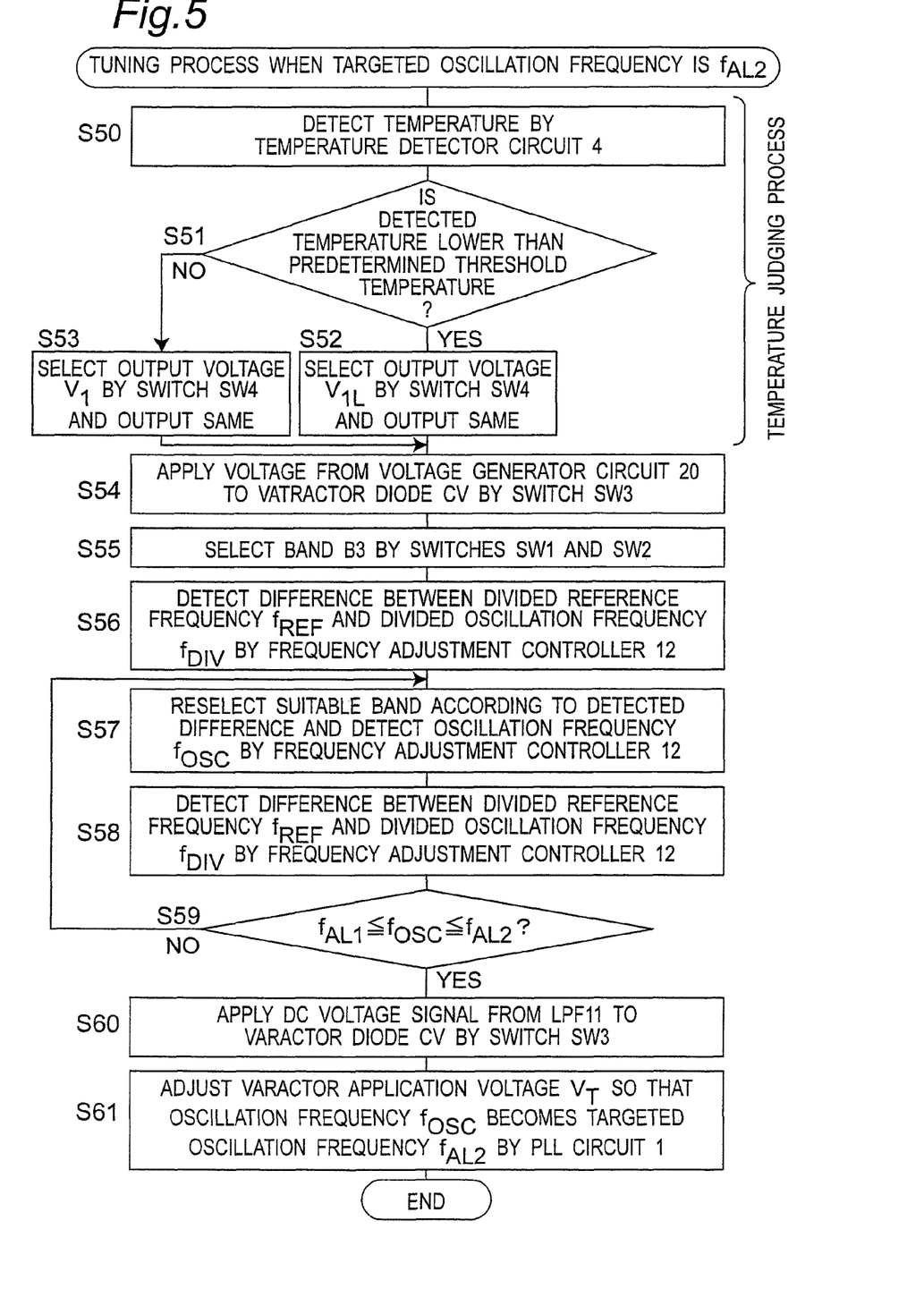
FIG. 5 is a flow chart showing a tuning process in the PLL circuit 1 of FIG. 1.

FIG. 5 is a flow chart showing a tuning process when the PLL circuit 1 of FIG. 1 is provided in the tuner. Referring to FIG. 5, such a case is described where a targeted oscillation frequency is $f_{AL2}$ as an example.

First of all, the temperature is detected by the temperature detector circuit 4 at step S50 of FIG. 5, and at step S51 it is determined whether or not the detected temperature is lower than the predetermined threshold temperature. If YES at step S51, the control flow goes to step S52. On the other hand, if NO at step S52, the control flow goes to step S53. At step S42, the output voltage $V_{1L}$ of the constant voltage source 21 is selected by the switch SW4 and outputted, and thereafter, the control flow goes to step S54. At step S53, the output voltage $V_1$ of the constant voltage source 22 is selected by the switch SW4 and outputted, and thereafter, the control flow goes to step S54. It is noted that the steps S50 to S53 are referred to as a temperature judging processes.

At step S54, the control voltage for coarse adjustment from the voltage generator circuit 5 is applied to the varactor diode CV by the switch SW3, and at step S55, for example, the band B3 is selected as an initial value by the switches SW1 and SW2. Next, at step S56, a difference between the divided reference frequency $f_{REF}$ and the divided oscillation frequency $f_{DIV}$ is detected by the frequency adjustment controller 12, and at step S57, control signals for reselecting a suitable band according to the detected difference are outputted to the switches SW1 and SW2, and the oscillation frequency $f_{OSC}$ is detected by the frequency adjustment controller 12. Next, at step S58, a difference between the divided reference frequency $f_{REF}$ and the divided oscillation frequency $f_{DIV}$ is detected by the frequency adjustment controller 12, and at step S59, it is determined whether or not the oscillation frequency $f_{OSC}$ is equal to of higher than the lower limit frequency $f_{AL1}$ and equal to or lower than the upper limit frequency $f_{AL2}$. If YES at step S59, the control flow goes to step S60. On the other hand, if NO at step S59, the control flow returns to step S57, and the process of step S57 is repeated. At step S60, the DC voltage of the control voltage for fine adjustment from the LPF 11 is applied to the varactor diode CV by the switch SW3, by which a closed loop of the PLL circuit 1 and the VCO circuit 2 is constituted. At step S61, the varactor application voltage $V_T$ is adjusted by the PLL circuit 1 so that the oscillation frequency $f_{OSC}$ becomes the targeted oscillation frequency $f_{AL2}$.

Figure 10:
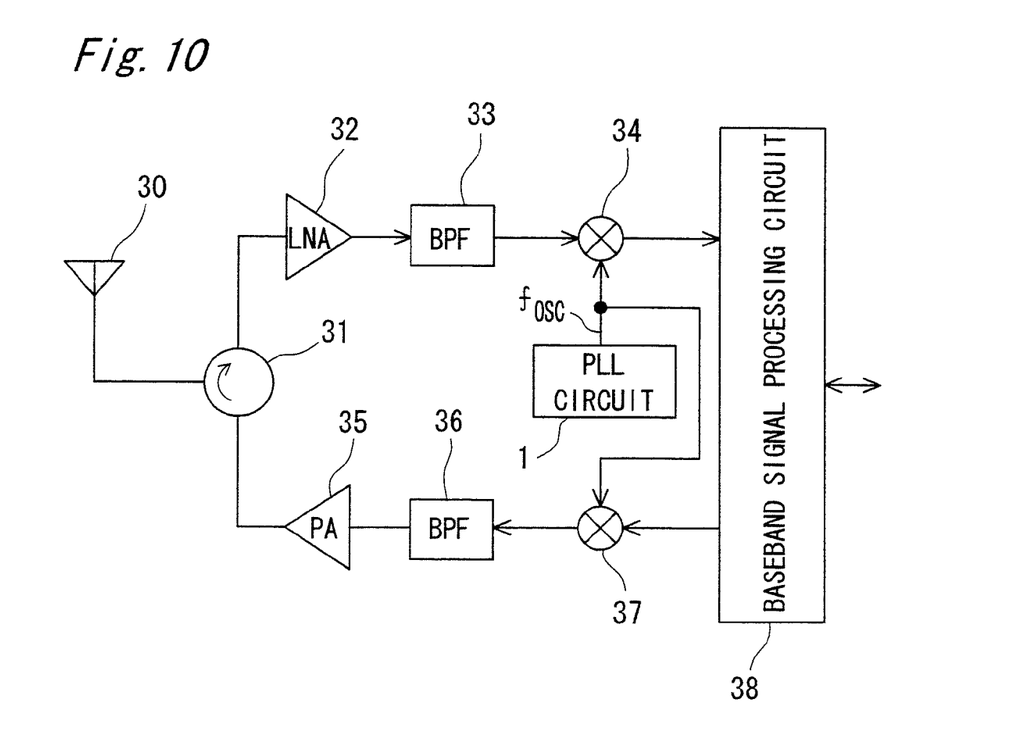
FIG. 10 is a block diagram showing a configuration of a wireless communication apparatus having the PLL circuit 1 of FIG. 1.

FIG. 10 is a block diagram showing a configuration of a wireless communication apparatus having the PLL circuit 1 of FIG. 1. Referring to FIG. 10, the wireless communication apparatus is configured to include the PLL circuit 1, an antenna 30, a circulator 31, a low-noise amplifier (referred to as a LNA hereinafter) 32, bandpass filters (referred to as BPF's hereinafter) 33 and 36, mixers 34 and 37, a power amplifier (referred to as a PA hereinafter) 35 and a baseband signal processing circuit 38.

Referring to FIG. 10, at the time of receiving of a wireless signal, a level of a wireless receiving signal received by the antenna 30 is amplified to a level required for low frequency conversion via the circulator 31 and the LNA 32, and thereafter, the amplified wireless receiving signal is outputted to the BPF 33 to pass therethrough a wireless receiving signal within a desired receiving band. The mixer 34 mixes the oscillation signal $f_{OSC}$ from the PLL circuit 1 with the wireless receiving signal within the desired receiving band so as to frequency-convert the wireless receiving signal into an intermediate frequency signal having a predetermined intermediate frequency, and outputs the intermediate frequency signal to the baseband signal processing circuit 38.

In addition, at the time of transmitting a wireless signal, a transmitting signal from the baseband signal processing circuit 38 is mixed with the oscillation signal $f_{OSC}$ from PLL circuit 1 by the mixer 37 so as to frequency-convert the transmitting signal into a transmitting frequency signal having a desired transmitting frequency. Then, the transmitting frequency signal is outputted to the BPF 36 so as to pass therethrough a transmitting signal within a desired transmitting band, and thereafter, the transmitting signal is wirelessly transmitted via the PA35, the circulator 31 and the antenna 30.

As described above, the PLL circuit 1 of the present preferred embodiment includes the temperature detector circuit 4 for detecting the temperature and the voltage generator circuit 5 for generating the control voltage for coarse adjustment corresponding to the detected temperature. Accordingly, the temperature margins of the oscillation frequency can be reduced and a wide oscillation frequency range can be obtained without deteriorating the phase noise.

In the present preferred embodiment, the temperature detector circuit 4 and the voltage generator circuit 5 have the two temperature divisions of the low temperature and the high temperature. However, the present invention is not limited to this configuration, and three or more temperature divisions may be provided. In the case, the temperature detector circuit 4 may operate to output a plurality of different temperature detection signals according to the temperature, and the voltage generator circuit 5 may operate to switchover among a plurality of output voltages according to the inputted temperature detection signal. In addition, in this case, the voltage generator circuit 5 may be configured to output an output voltage changing continuously according to the temperature detected by the temperature detector circuit 4.

In addition, the temperature detector circuit 4 and the voltage generator circuit 5 have the configurations shown in FIG. 2, however, the present invention is not limited to this configuration, and it is allowed to have another configuration as long as a voltage corresponding to the temperature can be outputted.

Further, the two capacitors C1 and C2 are connected in parallel to the varactor diode CV, however, the present invention is not limited to this configuration, and one or three or more capacitors may be connected in parallel to the varactor diode CV so that the desired oscillation frequency range and frequency control sensitivity can be obtained.

Still further, the resonance circuit includes the varactor diode CV, the capacitors C2 and C3 and the switches SW1 and SW2, however, the present invention is not limited to this configuration, and it is allowed to have another configuration that employs, for example, a capacitive element that utilizes the gate capacitance of a MOS transistor.

In addition, the VCO circuit 2 is the unbalanced type, however, the present invention is not limited to this configuration, and it is allowed to be the balanced type by employing, for example, a differential circuit.

Still further, in the temperature detector circuit 4, the current source 13 is set to output the current that changes depending on the temperature characteristic of the base-emitter voltage $V_{BE}$ of the bipolar transistor that constitutes the current source 13, and the voltage source 14 outputs the current constant regardless of the temperature change. However, the present invention is not limited to this configuration, and the current source 14 may be set to output a current that changes depending on temperature characteristic of a base-emitter voltage $V_{BE}$ of a bipolar transistor that constitutes the current source 14, and the current source 13 may be set to output a current constant regardless of the temperature change. Another configuration is acceptable as long as the current sources 13 and 14 output currents that change depending on temperature characteristics different from each other, respectively.

Second Preferred Embodiment

Figure 6:
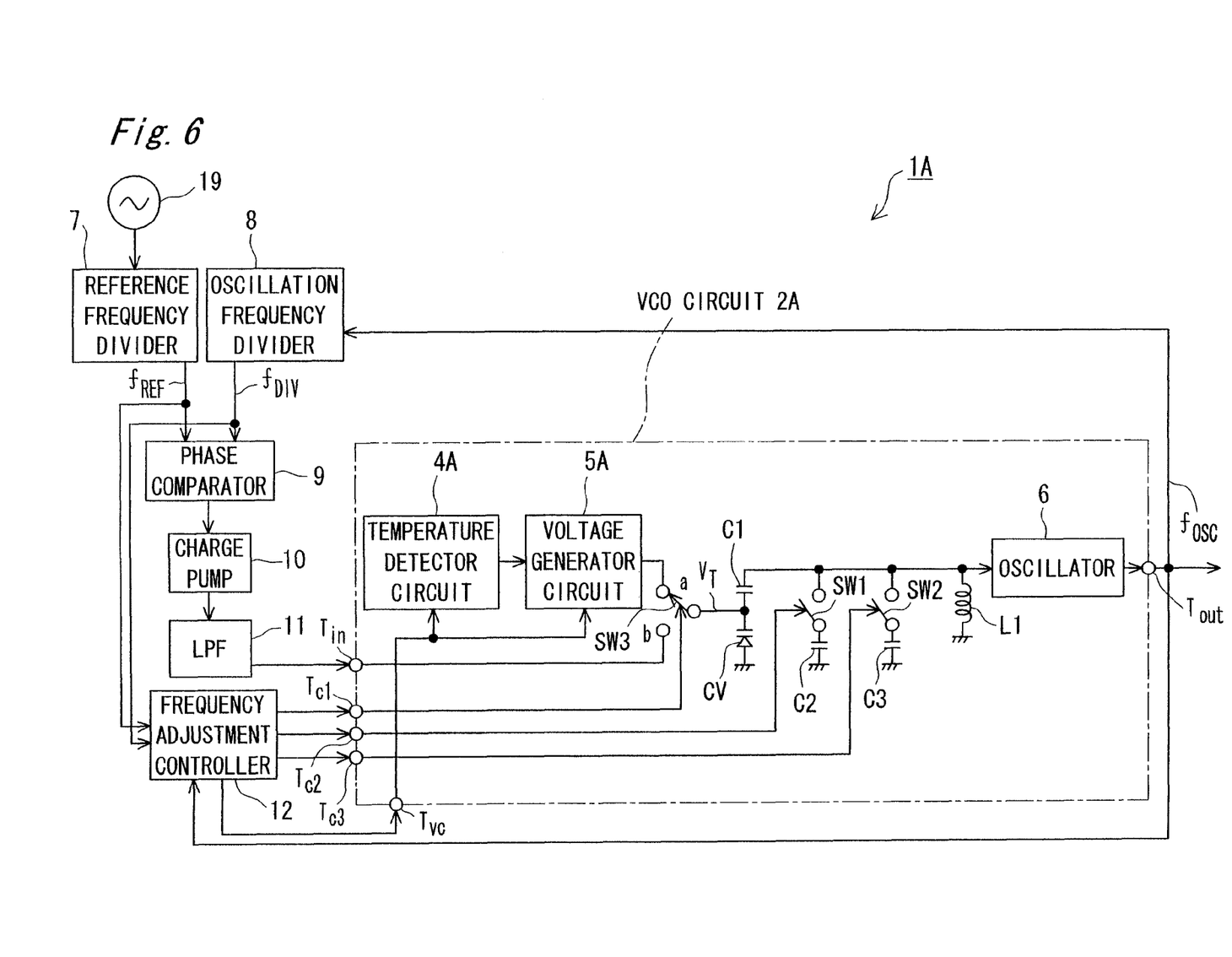
FIG. 6 is a block diagram showing a configuration of a PLL circuit 1A according to a second preferred embodiment of the present invention.

FIG. 6 is a block diagram showing a configuration of a PLL circuit 1A according to the second preferred embodiment of the present invention. Referring to FIG. 6, the PLL circuit 1A of the present preferred embodiment is different from the PLL circuit 1 of the first preferred embodiment in that a VCO circuit 2A is provided in stead of the VCO circuit 2 of FIG. 1. The VCO circuit 2A is different from the VCO circuit 2 of FIG. 1 in that a temperature detector circuit 4A and a voltage generator circuit 5A are provided in stead of the temperature detector circuit 4 and the voltage generator circuit 5. Regarding the points other than the above, the PLL circuit 1A is similar to the PLL circuit 1 of the first preferred embodiment shown in FIG. 1, and no detailed description is provided for the components denoted by the same reference numerals.

Referring to FIG. 6, the temperature detector circuit 4A and the voltage generator circuit 5A operate by power voltages, and the applied power voltages are controlled in response to a power control signal inputted via a power control terminal Tvc. Concretely speaking, at the time of coarse adjustment, i.e., when an output voltage from the voltage generator circuit 5A is selected by the switch SW3, predetermined power voltages are applied to the temperature detector circuit 4A and the voltage generator circuit 5A. At the time of fine adjustment, i.e., when the DC voltage from the LPF 11 via the voltage application terminal Tin is selected by the switch SW3, the power voltages of the temperature detector circuit 4A and the voltage generator circuit 5A are cut off or the currents of the power voltages of the temperature detector circuit 4A and the voltage generator circuit 5A are reduced in response to the power control signal. No description is provided for other operations since they are similar to those of the PLL circuit 1 of FIG. 1 of the first preferred embodiment.

As described above, according to the PLL circuit 1A of the present preferred embodiment, the power voltages are applied to the temperature detector circuit 4A and the voltage generator circuit 5A at the time of coarse adjustment of the oscillation frequency, and the power voltages of the temperature detector circuit 4A and the voltage generator circuit 5A are cut off or the currents of the power voltages of the temperature detector circuit 4A and the voltage generator circuit 5A are reduced at the time of fine adjustment. Accordingly, power consumption can be reduced as compared with the PLL circuit 1 of the first preferred embodiment.

Third Preferred Embodiment

Figure 7:
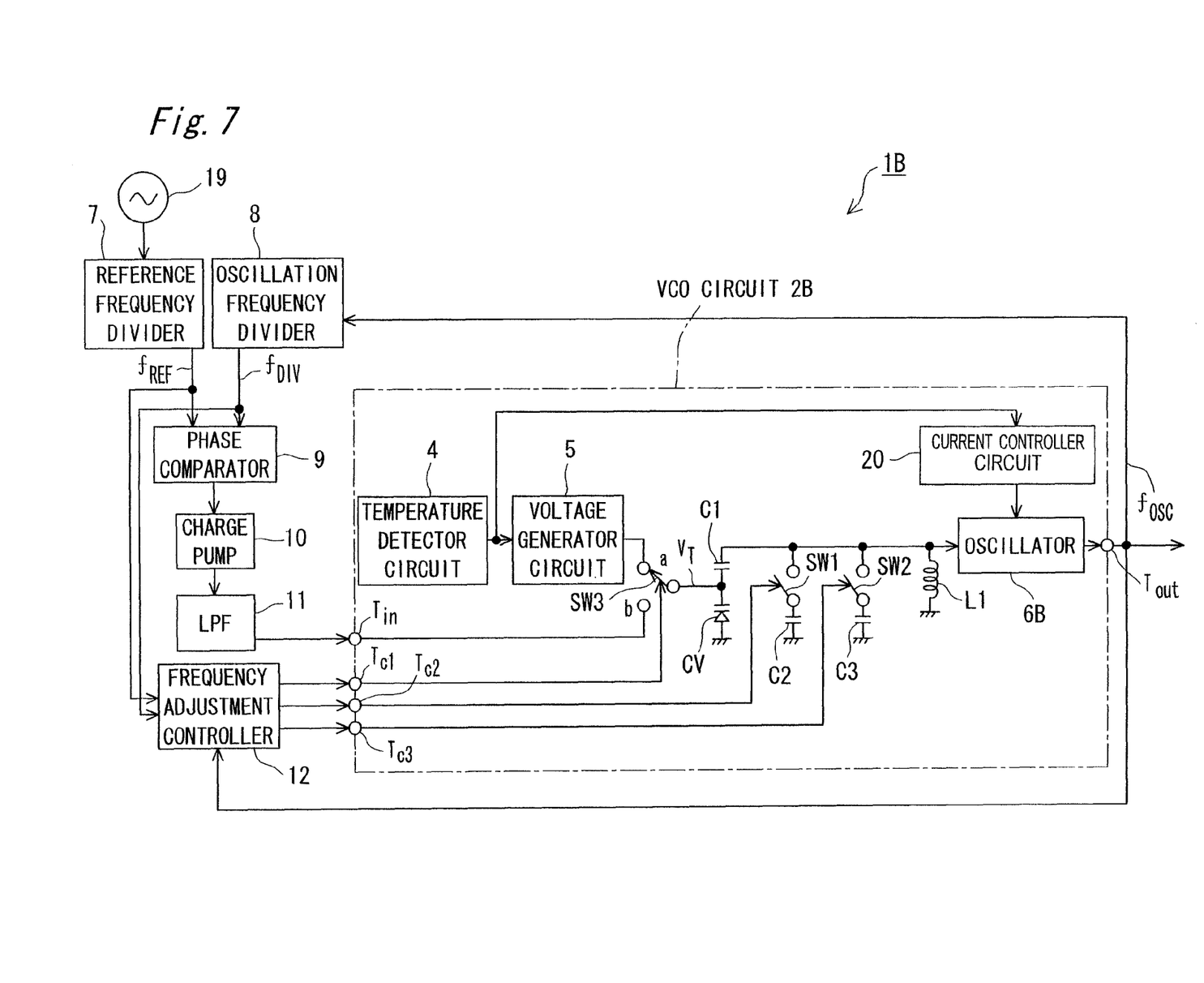
FIG. 7 is a block diagram showing a configuration of a PLL circuit 1B according to a third preferred embodiment of the present invention.

FIG. 7 is a block diagram showing a configuration of a PLL circuit 1B according to the third preferred embodiment of the present invention. Referring to FIG. 7, the PLL circuit 1B of the present preferred embodiment is different from the PLL circuit 1 of the first preferred embodiment shown in FIG. 1 in that a VCO circuit 2B is provided in stead of the VCO circuit 2 of FIG. 1. The VCO circuit 2B is different from the VCO circuit 2 of FIG. 1 in that an oscillator 6B is provided in stead of the oscillator 6, and a current controller circuit 20 connected between the temperature detector circuit 4 and the oscillator 6B is further provided. Regarding the points other than the above, the PLL circuit 1B is similar to the PLL circuit 1 of the first preferred embodiment shown in FIG. 1, and no detailed description is provided for the components denoted by the same reference numerals.

Referring to FIG. 7, the current controller circuit 20 controls a current of the oscillator 6B according to the signal indicating the temperature detection result from the temperature detector circuit 4. Concretely speaking, the current of the oscillator 6B is increased when the signal indicating the temperature detection result of the temperature detector circuit 4 indicates a temperature higher than a predetermined threshold temperature, and the current of the oscillator 6B is reduced when the signal indicating the temperature detection result of the temperature detector circuit 4 indicates a temperature equal to or lower than a predetermined threshold temperature, so as to optimize the current flowing through the oscillator 6 according to the operating temperature. In this case, the signal indicating the temperature detection result of the temperature detector circuit 4 are shared by the voltage generator circuit 5 and the current controller circuit 20. Accordingly, it is possible to optimize the current flowing through the oscillator 6B according to the operating temperature, keep a good phase noise characteristic within a wide temperature range, and reduce the current consumption of the oscillator 6B while scarcely increasing the circuit size thereof.

As described above, according to the PLL circuit 1B of the present preferred embodiment, the current flowing through the oscillator 6B is optimized according to the operating temperature by using the temperature detection result of the temperature detector circuit 4, and therefore, the power consumption can be reduced as compared with the PLL circuit 1 of the first preferred embodiment.

Fourth Preferred Embodiment

Figure 8:
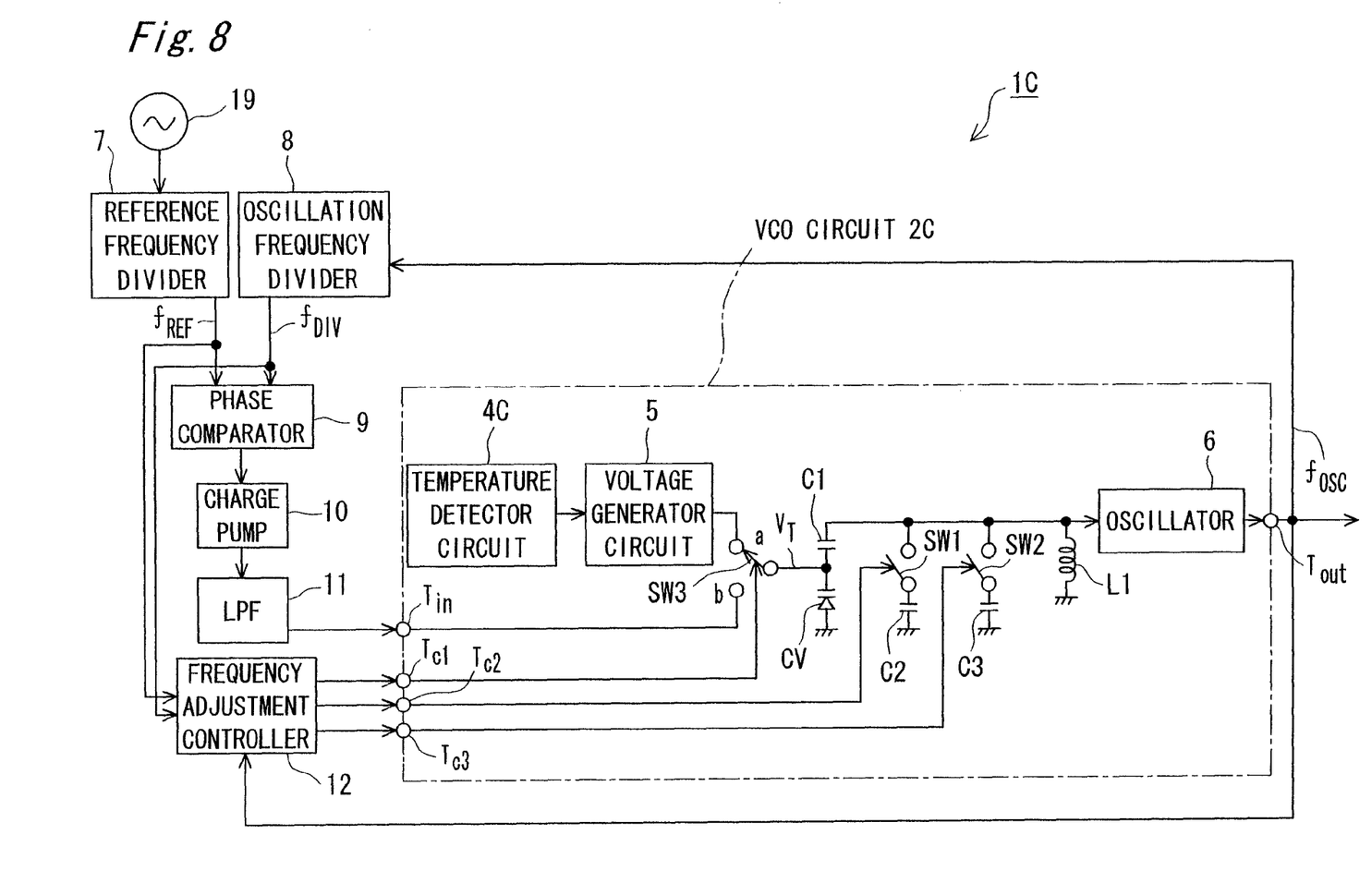
FIG. 8 is a block diagram showing a configuration of a PLL circuit 1C according to a fourth preferred embodiment of the present invention.

FIG. 8 is a block diagram showing a configuration of a PLL circuit 1C according to the fourth preferred embodiment of the present invention. Referring to FIG. 8, the PLL circuit 1C of the present preferred embodiment is different from the PLL circuit 1 of the first preferred embodiment shown in FIG. 1 in that a VCO circuit 2C is provided in stead of the VCO circuit 2 of FIG. 1. The VCO circuit 2C is different from the VCO circuit 2 of FIG. 1 in that a temperature detector circuit 4C is provided in stead of the temperature detector circuit 4 of FIG.

1. Regarding the points other than the above, the PLL circuit 1C is similar to the PLL circuit 1 of the first preferred embodiment shown in FIG. 1, and no detailed description is provided for the components denoted by the same reference numerals.

Figure 9:
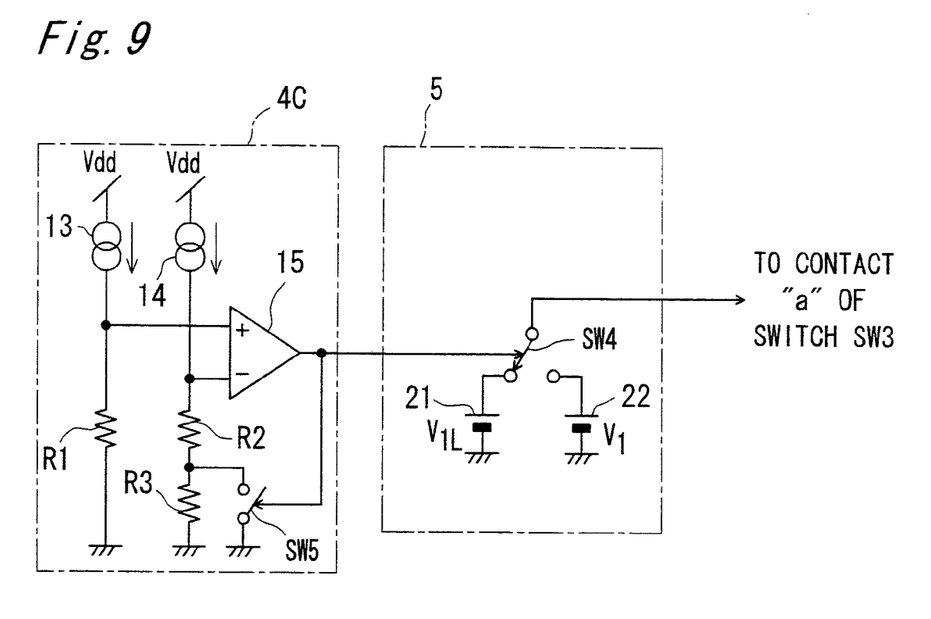
FIG. 9 is a circuit diagram showing one example of detailed configurations of a temperature detector circuit 4C and the voltage generator circuit 5 of FIG. 8.

FIG. 9 is a circuit diagram showing detailed configurations of the temperature detector circuit 4C and the voltage generator circuit 5. Referring to FIG. 9, as compared with the temperature detector circuit 4 of the PLL circuit 1 of the first preferred embodiment shown in FIG. 2, the temperature detector circuit 4C further includes a resistor R3 connected between the resistor R2 and the ground potential, and a switch SW5 that is connected in parallel to the resistor R3 and controlled to be turned on and off by the output signal of the comparator 15.

Referring to FIG. 9, the temperature detector circuit 4C performs switchover of a value of the resistance connected to the current source 14 between the resistance value of the resistor R2 and the sum of the resistance values of the resistor R2 and the resistor R3 by the switch SW5 controlled by the output signal from the comparator 15. Accordingly, it is possible to switch the reference voltage on the current source 14 side according to the output signal from the comparator 15, and this enables the operation similar to that of a hysteresis comparator. Generally speaking, a lock-up time of equal to or shorter than several milliseconds is required at the time of tuning, and therefore, the resistance value of the resistor R3 may be set so as to provide a hysteresis width of equal to or larger than the range of the temperature change within this lock-up time.

With the configuration as described above, since the temperature detector circuit 4C has a hysteresis characteristic, even when the temperature detector circuit 4C is operating at a temperature around the predetermined threshold temperature, the output voltage of the voltage generator circuit 5 does not change during the execution of the adjustment operation in such a case when the variation in temperature is within the hysteresis width. Therefore, it is possible to hold the output voltage of the voltage generator circuit 5 at a constant at the time of coarse adjustment when the switch SW3 of FIG. 8 selects the output voltage of the voltage generator circuit 5. In addition, since the switchover of the resistance value is performed by the switch SW5, there is no increase in the current consumption.

As described above, according to the PLL circuit 1C of the present preferred embodiment, the temperature detector circuit 4C has the hysteresis characteristic. Therefore, it is possible to hold the output voltage of the voltage generator circuit 5 at a constant at the time of coarse adjustment of the oscillation frequency without increasing the current consumption.

In the present preferred embodiment, the temperature detector circuit 4C has the circuit configuration of FIG. 9 as one example of the configuration for achieving the hysteresis characteristic. However, the present invention is not limited to this configuration, and another configuration may be employed. In addition, such a configuration is employed that the output voltage of the voltage generator circuit 5 is held at a constant by the hysteresis characteristic, however, such a configuration may be employed that an output logic of the temperature detector circuit 4C is held using a logic circuit or the like.

When wireless apparatuses employing the respective PLL circuit 1, 1A, 1B and 1C of the first to fourth preferred embodiments are used for tuners and the like, broadcasting in a wide frequency range can be received, and high-quality video signal and audio signal can be reproduced with a good phase noise characteristic.

In addition, when wireless apparatuses employing the respective PLL circuit 1, 1A, 1B and 1C of the first to fourth preferred embodiments are used for communication systems and the like, the communication system can comply with communication standards having frequency bands different from each other, and transmit and receive high-quality video signal, audio signal and data signal with a good phase noise characteristic.

INDUSTRIAL APPLICABILITY

As described above, the voltage controlled oscillator circuit of the present invention and the wireless communication apparatus having the same circuit according to the present invention include the temperature detector means for generating the first control voltage for coarse adjustment corresponding to the temperature detected by detecting the temperature and outputting the same voltage, and therefore, exhibit such an advantageous effect that the temperature margins of the oscillation frequency can be reduced and a wide oscillation frequency range can be obtained without deteriorating the phase noise.

The voltage controlled oscillator circuit of the present invention and the wireless communication apparatus having the same circuit can be utilized for, for example, a tuner and a communication system.

The invention claimed is:

1. A voltage controlled oscillator circuit comprising:
   a temperature detector circuit for detecting a temperature, generating a first control voltage for coarse adjustment corresponding to the detected temperature, and outputting the first control voltage;
   a switch for selecting one of an inputted second control voltage for fine adjustment and the first control voltage for coarse adjustment;
   a resonance circuit having a predetermined resonance frequency, and including a varactor element having a capacitance value adjusted based on a control voltage selected by the switch, at least one capacitor, and an inductor; and
   an oscillator for generating an oscillation signal having an oscillation frequency corresponding to the resonance frequency using the resonance circuit, and outputting the oscillation signal;
   wherein the temperature detector circuit changes a range of the oscillation frequency of the oscillator by generating the first control voltage for coarse adjustment having a first output voltage value when the detected temperature is lower than a predetermined threshold temperature, and generating the first control voltage for coarse adjustment having a second output voltage value higher than the first output voltage value when the detected temperature is equal to or higher than a predetermined threshold temperature.

2. The voltage controlled oscillator circuit as claimed in claim 1,
   wherein the temperature detector circuit operates by a power voltage, and the applied power voltage is controlled in response to an inputted power control signal.

3. The voltage controlled oscillator circuit as claimed in claim 1, further comprising a current controller circuit for controlling a current of the oscillator in response to the temperature detected by the temperature detector circuit.

4. The voltage controlled oscillator circuit as claimed in claim 1,
   wherein the temperature detector circuit holds the first control voltage at a constant when the switch selects the first control voltage.

5. The voltage controlled oscillator circuit as claimed in claim 1, further comprising a phase locked loop circuit for generating the second control voltage based on an oscillation signal outputted by the voltage controlled oscillator circuit.

6. A wireless communication apparatus for transmitting and receiving a wireless signal, the apparatus comprising:
a voltage controlled oscillator circuit including:
   a temperature detector circuit for detecting a temperature, generating a first control voltage for coarse adjustment corresponding to the detected temperature, and outputting the first control voltage;
   a switch for selecting one of an inputted second control voltage for fine adjustment and the first control voltage for coarse adjustment;
   a resonance circuit having a predetermined resonance frequency, and including a varactor element having a capacitance value adjusted based on a control voltage selected by the switch, at least one capacitor, and an inductor; and
   an oscillator for generating an oscillation signal having an oscillation frequency corresponding to the resonance frequency using the resonance circuit, and outputting the oscillation signal;
   wherein the temperature detector circuit changes a range of the oscillation frequency of the oscillator by generating the first control voltage for coarse adjustment having a first output voltage value when the detected temperature is lower than a predetermined threshold temperature, and generating the first control voltage for coarse adjustment having a second output voltage value higher than the first output voltage value when the detected temperature is equal to or higher than a predetermined threshold temperature; and
a frequency converter device for performing frequency conversion on the wireless signal by using the oscillation signal from the voltage controlled oscillator circuit.

7. A voltage controlled oscillator circuit comprising:
a temperature detector circuit for detecting a temperature, generating a first control voltage for coarse adjustment corresponding to the detected temperature, and outputting the first control voltage;
a switch for selecting one of an inputted second control voltage for fine adjustment and the first control voltage for coarse adjustment;
a resonance circuit having a predetermined resonance frequency, and including a varactor element having a capacitance value adjusted based on a control voltage selected by the switch, at least one capacitor, and an inductor; and
an oscillator for generating an oscillation signal having an oscillation frequency corresponding to the resonance frequency using the resonance circuit, and outputting the oscillation signal,
wherein the temperature detector circuit comprises:
a first current source for outputting a first current which changes with a predetermined temperature characteristic; and
a second current source for outputting a constant second current regardless of temperature change,
wherein the temperature detector circuit converts the first current into a detected voltage corresponding to the detected temperature, converts the second current into a reference voltage corresponding to a predetermined threshold temperature, and compares the detected temperature with the predetermined threshold temperature by comparing the detected voltage with the reference voltage, and
wherein the temperature detector circuit changes a range of the oscillation frequency of the oscillator by generating the first control voltage for coarse adjustment having a first output voltage value when the detected temperature is lower than a predetermined threshold temperature, and generating the first control voltage for coarse adjustment having a second output voltage value higher than the first output voltage value when the detected temperature is equal to or higher than a predetermined threshold temperature.

8. The voltage controlled oscillator circuit as claimed in claim 7,
wherein the temperature detector circuit operates by a power voltage, and the applied power voltage is controlled in response to an inputted power control signal.

9. The voltage controlled oscillator circuit as claimed in claim 7, further comprising a current controller circuit for controlling a current of the oscillator in response to the temperature detected by the temperature detector circuit.

10. The voltage controlled oscillator circuit as claimed in claim 7,
wherein the temperature detector circuit holds the first control voltage at a constant when the switch selects the first control voltage.

11. The voltage controlled oscillator circuit as claimed in claim 7, further comprising a phase locked loop circuit for generating the second control voltage based on an oscillation signal outputted by the voltage controlled oscillator circuit.

12. A wireless communication apparatus for transmitting and receiving a wireless signal, the apparatus comprising:
a voltage controlled oscillator circuit comprising:
   a temperature detector circuit for detecting a temperature, generating a first control voltage for coarse adjustment corresponding to the detected temperature, and outputting the first control voltage;
   a switch for selecting one of an inputted second control voltage for fine adjustment and the first control voltage for coarse adjustment;
   a resonance circuit having a predetermined resonance frequency, and including a varactor element having a capacitance value adjusted based on a control voltage selected by the switch, at least one capacitor, and an inductor; and
   an oscillator for generating an oscillation signal having an oscillation frequency corresponding to the resonance frequency using the resonance circuit, and outputting the oscillation signal,
   wherein the temperature detector circuit comprises:
      a first current source for outputting a first current which changes with a predetermined temperature characteristic; and
      a second current source for outputting a constant second current regardless of temperature change,
   wherein the temperature detector circuit converts the first current into a detected voltage corresponding to the detected temperature, converts the second current into a reference voltage corresponding to a predetermined threshold temperature, and compares the detected temperature with the predetermined threshold temperature by comparing the detected voltage with the reference voltage, and
   wherein the temperature detector circuit changes a range of the oscillation frequency of the oscillator by generating the first control voltage for coarse adjustment having a first output voltage value when the detected temperature is lower than a predetermined threshold temperature, and generating the first control voltage for coarse adjustment having a second output voltage value higher than the first output voltage value when the detected temperature is equal to or higher than a predetermined threshold temperature; and
said wireless communication apparatus further comprising a frequency converter device for performing frequency conversion on the wireless signal by using the oscillation signal from the voltage controlled oscillator circuit.

* * * * *